United States Patent
Ahn (10) Patent No.: US 9,583,448 B2
(45) Date of Patent: Feb. 28, 2017

(54) CHIP ON FILM AND DISPLAY DEVICE HAVING THE SAME

(71) Applicant: Samsung Display Co., Ltd., Yongin, Gyeonggi-Do (KR)

(72) Inventor: Hyeong-Cheol Ahn, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 53 days.

(21) Appl. No.: 14/021,302

(22) Filed: Sep. 9, 2013

(65) Prior Publication Data

US 2014/0306348 A1 Oct. 16, 2014

(30) Foreign Application Priority Data

Apr. 15, 2013 (KR) ........................ 10-2013-0041240

(51) Int. Cl.
*H01L 23/00* (2006.01)
*H05K 1/02* (2006.01)
*H01L 23/498* (2006.01)
*G02F 1/1345* (2006.01)
(Continued)

(52) U.S. Cl.
CPC ........ *H01L 23/562* (2013.01); *H01L 23/4985* (2013.01); *H05K 1/0281* (2013.01); *G02F 1/13452* (2013.01); *H01L 2224/16225* (2013.01); *H01L 2224/32225* (2013.01); *H01L 2224/73204* (2013.01); *H05K 1/189* (2013.01); *H05K 3/3452* (2013.01); *H05K 2201/10128* (2013.01); *H05K 2201/10681* (2013.01); *H05K 2201/2009* (2013.01); *H05K 2203/0577* (2013.01)

(58) Field of Classification Search
CPC ............. H01L 27/3293; H01L 51/5237; H01L 23/562; H04M 1/0266; H05K 7/00; H05K 1/028; H05K 3/323; H05K 1/147; H05K 1/189; H05K 1/0218; H05K 2201/0352
USPC ......... 313/512, 503; 257/773; 361/736, 748, 361/749, 750, 751
See application file for complete search history.

(56) References Cited

U.S. PATENT DOCUMENTS

2002/0027634 A1 3/2002 Kang et al.
2005/0110049 A1* 5/2005 Urushido ...................... 257/202
2005/0167803 A1 8/2005 Imamura
(Continued)

FOREIGN PATENT DOCUMENTS

KR 10-2009-0065803 6/2009
KR 10-2010-0123755 11/2010
(Continued)

*Primary Examiner* — David Vu
*Assistant Examiner* — Mouloucoulaye Inoussa
(74) *Attorney, Agent, or Firm* — Robert E. Bushnell, Esq.

(57) ABSTRACT

A flexible chip on film includes a base insulating layer, a metal layer disposed on an upper surface of the base insulating layer and including a circuit pattern, an integrated circuit chip disposed on an upper surface of the metal layer and electrically connected to the metal layer, a solder resist layer disposed on the metal layer and insulated from the integrated circuit chip, and a reinforcing layer disposed on an upper surface of the solder resist layer. When the chip on film COF is bent, a neutral surface, in which a vector sum of a tensile force and a compressive force becomes substantially zero, is placed in the metal layer.

12 Claims, 3 Drawing Sheets

(51) Int. Cl.
    *H05K 1/18*    (2006.01)
    *H05K 3/34*    (2006.01)

(56) References Cited

U.S. PATENT DOCUMENTS

| | | | |
|---|---|---|---|
| 2006/0028128 A1* | 2/2006 | Ohkubo | H01L 51/5237 |
| | | | 313/506 |
| 2006/0060949 A1 | 3/2006 | Naitoh | |
| 2009/0151988 A1* | 6/2009 | Lee | H05K 1/0218 |
| | | | 174/254 |
| 2010/0002402 A1 | 1/2010 | Rogers et al. | |
| 2011/0050657 A1* | 3/2011 | Yamada | H01L 27/3293 |
| | | | 345/204 |
| 2013/0148312 A1* | 6/2013 | Han | H05K 7/00 |
| | | | 361/736 |

FOREIGN PATENT DOCUMENTS

| | | |
|---|---|---|
| KR | 1020110039283 A | 4/2011 |
| KR | 10-2011-0060328 | 6/2011 |
| WO | 2010/032780 | 3/2010 |

* cited by examiner

CHIP ON FILM AND DISPLAY DEVICE
HAVING THE SAME

CLAIM OF PRIORITY

This application makes reference to, incorporates the same herein, and claims all benefits accruing under 35 U.S.C. §119 from an application earlier filed in the Korean Intellectual Property Office on 15 Apr. 2013 and there duly assigned Serial No. 10-2013-0041240.

BACKGROUND OF THE INVENTION

Field of the Invention

Embodiments of the present invention relate to a chip on film and a display device having the same, and more particularly, to a chip on film capable of being prevented from being cracked when the chip on film is bent and a display device having the same.

Description of the Related Art

In recent years, as the information society has developed rapidly, display devices that display massive data caused by various electrical signals as images have been extremely developed. In particular, as display devices having advantageous features such as thinner thickness, lighter weight, lower voltage, and lower power consumption, various display devices, e.g., a liquid crystal display device, a plasma display panel device, a field emission display device, an organic electroluminescence display device, etc., have been suggested.

In general, the above-mentioned flat panel display device includes a display panel that displays the images and a driving circuit board that is connected to a side of the display panel. The driving circuit board includes a chip on film having one end portion connected to the display panel and a printed circuit board connected to the other one end portion of the chip on film. The chip on film is provided with a data driving integrated circuit chip mounted thereon and the printed circuit board is provided with a base driving integrated circuit chip mounted thereon. The driving circuit board applies a driving signal to the display panel to display the images.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention provides a chip on film capable of being prevented from being cracked when the chip on film is bent.

Another aspect of the present invention provides a display device having the chip on film.

Embodiments of the present invention provide a flexible chip on film including a base insulating layer, a metal layer disposed on an upper surface of the base insulating layer and including a circuit pattern, an integrated circuit chip disposed on an upper surface of the metal layer and electrically connected to the metal layer, a solder resist layer disposed on the metal layer and insulated from the integrated circuit chip, and a reinforcing layer disposed on an upper surface of the solder resist layer. When the chip on film COF is bent, a neutral surface, in which a vector sum of a tensile force and a compressive force becomes substantially zero, is placed in the metal layer.

The solder resist layer includes a cured resin.

The reinforcing layer has an area equal to or smaller than an area of the solder resist layer and the reinforcing layer has a film shape. In addition, the reinforcing layer includes a same material as the solder resist layer and is positioned in an area in which the chip on film is bent.

Embodiments of the present invention provide a display device including a display panel that includes a display area in which an image is displayed and a non-display area disposed adjacent to the display area and a chip on film disposed at one side of the non-display area and having flexibility.

The chip on film includes a base insulating layer, a metal layer disposed on an upper surface of the base insulating layer and including a circuit pattern, an integrated circuit chip disposed on an upper surface of the metal layer and electrically connected to the metal layer, a solder resist layer disposed on the metal layer and insulated from the integrated circuit chip, and a reinforcing layer disposed on an upper surface of the solder resist layer. When the chip on film COF is bent, a neutral surface, in which a vector sum of a tensile force and a compressive force becomes substantially zero, is placed in the metal layer.

The chip on film is bent to surround an edge of the non-display area and the integrated circuit chip makes contact with a lower surface of the display panel.

The solder resist layer includes a cured resin.

The reinforcing layer has an area equal to or smaller than an area of the solder resist layer and the reinforcing layer has a film shape. In addition, the reinforcing layer includes a same material as the solder resist layer and is positioned in an area in which the chip on film is bent.

According to the above, the reinforcing layer is disposed on the solder resist layer of the chip on film, and thus crack of the metal layer, defect of the chip on film, and defect of the display device may be prevented even though the chip on film is bent. In addition, the chip on film and the display device may be slimmed and a manufacturing process of the chip on film and the display device may be simplified.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
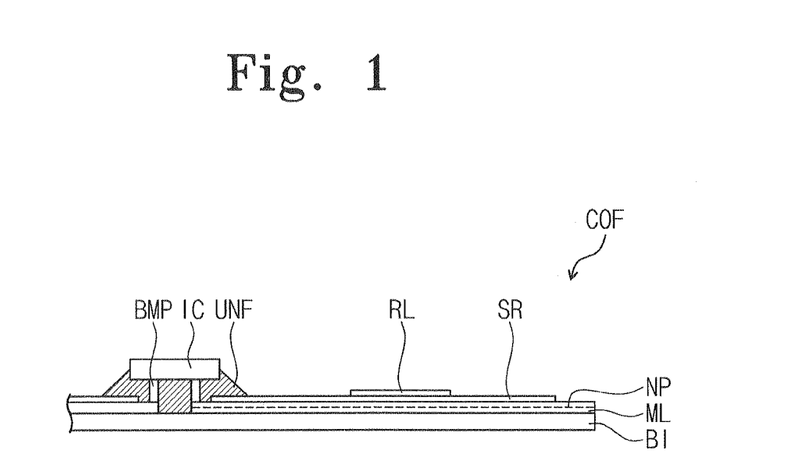
FIG. 1 is a cross-sectional view showing a chip on film according to an exemplary embodiment of the present disclosure.

FIG. 1 is a cross-sectional view showing a chip on film COF according to an exemplary embodiment of the present disclosure.

In reference to FIG. 1, the chip on film COF includes a base insulating layer BI, a metal layer ML disposed on an upper surface of the base insulating layer BI, and an integrated circuit chip IC disposed on an upper surface of the metal layer ML and electrically insulated from the metal layer ML. In addition, the chip on film COF further includes a solder resist layer SR disposed on the metal layer ML and electrically insulated from the integrated circuit chip IC and a reinforcing layer RL disposed on an upper surface of the solder resist layer SR.

The chip on film COF has flexibility, and thus a neutral surface NP, in which a vector sum of tensile force and compressive force becomes substantially zero when the chip on film COF is bent, is placed in the chip on film COF. The neutral surface NP is positioned on the meal layer ML.

The base insulating layer BI may be, but not limited to, an insulating film with flexibility and rigidity. In detail, the base insulating layer BI includes at least one of polyimide, polyethernitrile, polyethersulfone, polyethyleneterephthalate, polyethylenenaphthalate, and polyvinylchloride.

The metal layer ML includes a circuit pattern. The metal layer ML may be discontinuously provided on the base insulating layer BI. That is, opening areas may exist on the base insulating layer BI in which the metal layer is not provided.

The metal layer ML includes stainless, copper (Cu), iron (Fe), aluminum (Al), or an alloy having at least one of these metals as a main component. In addition, the metal layer ML may include copper plated with tin (Sn), copper plated with gold (Au), or an alloy having at least one of these metals as a main component.

A plurality of conductive bumps BMP are disposed at a boundary of the opening areas on the metal layer ML. The conductive bumps BMP are adhered to the metal layer ML. The integrated circuit chip IC is connected onto the conductive bumps BMP. In this case, the conductive bumps BMP have a thickness enough to prevent the integrated circuit chip IC from making contact with the solder resist layer SR and the reinforcing layer RL. Consequently, the metal layer ML and the integrated circuit chip IC are electrically connected to each other via the conductive bumps BMP.

The conductive bumps BMP includes at least one of gold (Au), aluminum (Al), aluminum (Al) alloy, chromium (Cr), chromium (Cr) alloy, molybdenum (Mo), molybdenum (Mo) alloy, silver (Ag), silver (Ag) alloy, copper (Cu), or Nickel (Ni), or an alloy thereof.

The solder resist layer SR is disposed on the metal layer ML to be spaced apart from the conductive bumps BMP. The solder resist layer SR is formed by coating a liquid insulating resin and curing the coated liquid insulating resin. The solder resist layer SR prevents conductive foreign substance from directly attaching to the metal layer ML, and thus short circuits may be prevented. A thickness of the solder resist SR may be about 5 micrometers to about 25 micrometers.

An underfill UNF is filled around the integrated circuit chip IC. For instance, a portion of a side surface of the integrated circuit chip IC and a peripheral area of both ends of the metal layer ML are filled with the underfill UNF. The underfill UNF is formed by curing a liquid resin and provided to the peripheral area of the integrated circuit chip IC, thereby stably holding the integrated circuit chip IC. In addition, the underfill UNF improves moisture resistance and mechanical strength of the chip on film COF.

The reinforcing layer RL has an area equal to or smaller than an area of the solder resist layer SR. When the area of the reinforcing layer RL is smaller than that of the solder resist layer SR, the reinforcing layer RL is spaced apart from the underfill UNF.

The reinforcing layer RL has a film shape formed of an organic polymer and is disposed on the solder resist layer SR while interposing an adhesive therebetween. For instance, the reinforcing layer RL includes at least one of polyimide, polyurethane, or polyethyleneterephthalate. The reinforcing layer RL may be formed of the same material as the solder resist layer SR. That is, after the solder resist layer SR is formed by coating the liquid insulating resin and curing the coated liquid insulating resin, the reinforcing layer RL is formed by coating the liquid insulating resin on a predetermined area of the solder resist layer SR again and curing the liquid insulating resin.

On the neutral surface NP, the vector sum of the tensile force and the compressive force becomes substantially zero when the chip on film COF is bent. Accordingly, a deformation rate of the chip on film COF, which is caused by a bending stress applied to the chip on film COF, becomes substantially zero on the neutral surface NP.

The position of the neutral surface NP is determined in dependence upon thickness and elastic modulus of each of the layers forming the chip on film COF. The layers include the base insulating layer BI, the metal layer ML, the solder resist layer SR, and the reinforcing layer RL. That is, when the thickness and the elastic modulus of each layer are changed, the position of the neutral surface NP is shifted, and thus a specific area of the chip on film COF may be prevented from being deformed.

Thus, when the neutral surface NP is positioned in the metal layer ML, the metal layer ML is not deformed in the area in which the chip on film COF is bent and the crack does not occur on the metal layer ML even though the being stress occurs on the chip on film COF, which is caused by the bending of the chip on film COF.

To allow the neutral surface NP to be positioned in the metal layer ML, the thickness and the elastic modulus of the reinforcing layer RL are determined to correspond to the thickness and the elastic modulus of the base insulating layer BI, the metal layer ML, and the solder resist layer SR. When the reinforcing layer RL is not disposed on the metal layer ML, the neural surface NP is not positioned in the metal layer ML, but when the reinforcing layer RL is disposed on the metal layer ML, the neural surface NP is positioned in the metal layer ML.

In the present exemplary embodiment, the reinforcing layer RL is disposed on the metal layer ML and the neutral surface NP is positioned in the metal layer ML, and thus the metal layer ML may be prevented from being cracked and the defect may be prevented from occurring in the chip on film COF.

In the above-mentioned chip on film COF, the area of the reinforcing layer RL is smaller than the area of the solder resist layer SR and the reinforcing layer RL is disposed in the area in which the chip on film COF is bent. In this case, since the reinforcing layer RL is additionally disposed on the metal layer ML, the metal layer ML may be prevented from being cracked without increasing the thickness when the chip on film COF is bent.

In the chip on film COF, a portion of the neutral surface NP may be positioned in the metal layer ML only in the area in which the chip on film COF is bent, and a remaining portion of the neural surface NP may be positioned at the boundary surface between the metal layer ML and the solder resist layer SR.

In addition, when the reinforcing layer RL is formed of the same material as the solder resist layer SR, the process required to manufacture the chip on film COF may be simplified. That is, when the similar processes, e.g., the processes of coating and curing the liquid insulating resin, are consecutively performed by varying an area in which the resin is coated, the processes required to form the solder resist layer SR and the reinforcing layer RL are simplified, thereby reducing a manufacturing cost of the solder resist layer SR and the reinforcing layer RL.

Figure 2:
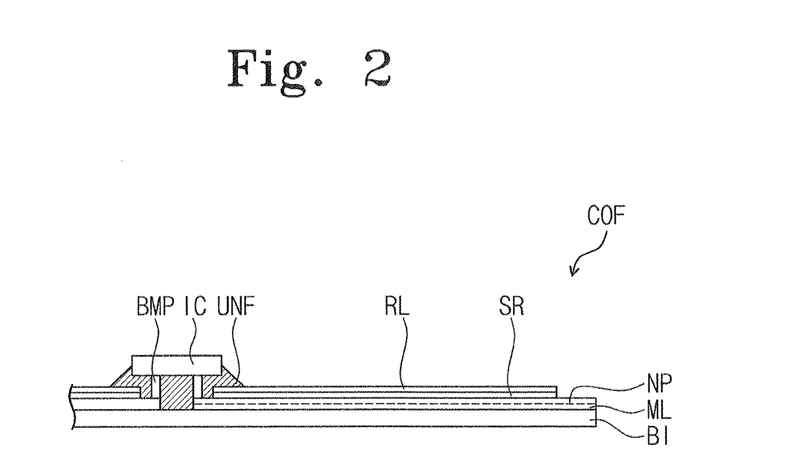
FIG. 2 is a cross-sectional view showing a chip on film according to another exemplary embodiment of the present disclosure.

Hereinafter, FIG. 2 is a cross-sectional view showing a chip on film according to another exemplary embodiment of the present disclosure. In FIG. 2, the same reference numerals denote the same elements in FIG. 1, and thus detailed descriptions of the same elements will be omitted.

In the present exemplary embodiment shown in FIG. 2, a reinforcing layer RL' has an area different from the area of the reinforcing layer RL shown in FIG. 1. The area of the reinforcing layer RL' is equal to the area of the solder resist layer SR. Therefore, the reinforcing layer RL' is not spaced apart from the underfill UNF when viewed in a plan view, and thus a portion of the reinforcing layer RL' is covered by the underfill UNF.

In this case, although the area in which the chip on film COF is bent is changed, the neutral surface NP is positioned in the metal layer ML. That is, even though any area of the chip on film COF is bent except for the area in which the integrated circuit chip IC is disposed, the neutral surface NP in the area in which the chip on film COF is bent is always positioned in the metal layer ML, and thus the metal layer ML may be prevented from being cracked.

When the reinforcing layer RL' is formed of the same material as the solder resist layer SR, the process of manufacturing the chip on film COF is more simplified and the manufacturing cost of the chip on film COF is reduced. That is, when the similar processes, e.g., the processes of coating and curing the liquid insulating resin, are consecutively performed by varying the area in which the resin is coated, the processes required to form the solder resist layer SR and the reinforcing layer RL are simplified, thereby reducing the manufacturing cost of the chip on film COF including the solder resist layer SR and the reinforcing layer RL. In the present exemplary embodiments shown in FIG. 2, a thickness of the solder resist SR may be about 5 micrometers to about 25 micrometers, and a thickness of the reinforcing layer RL is about 30 micrometers to about 40 micrometers.

Figure 3:
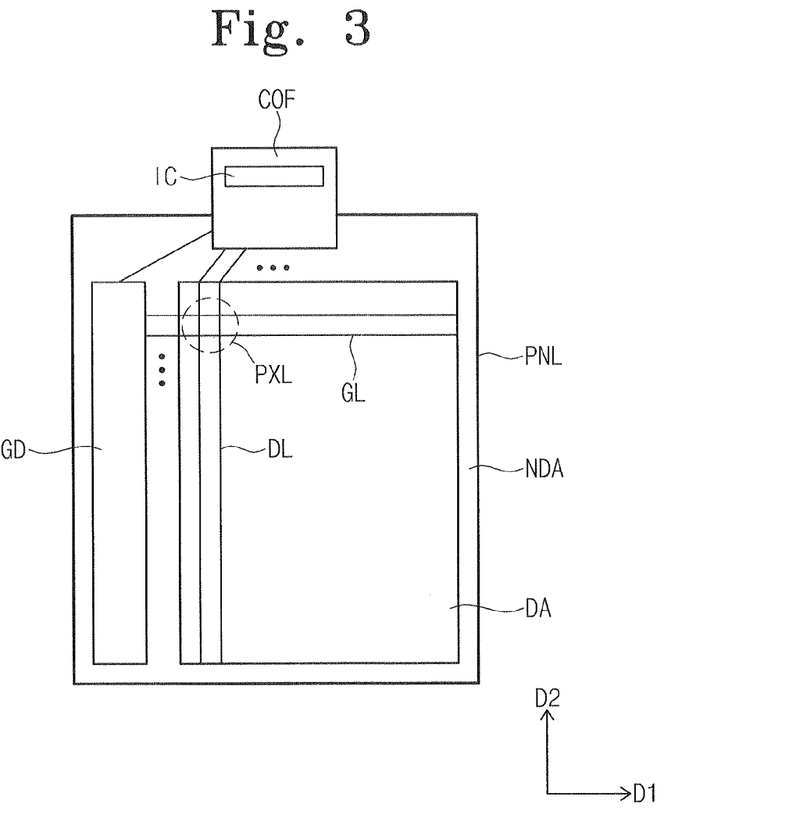
FIG. 3 is a plan view showing a display device according to an exemplary embodiment of the present disclosure.
Figure 4:
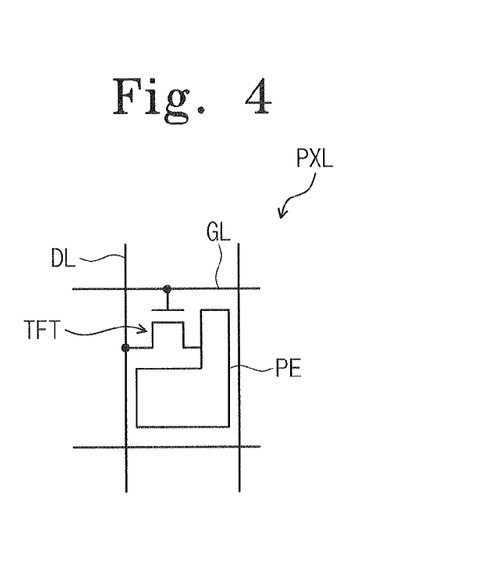
FIG. 4 is a circuit diagram showing a pixel area shown in FIG. 3.
Figure 5:
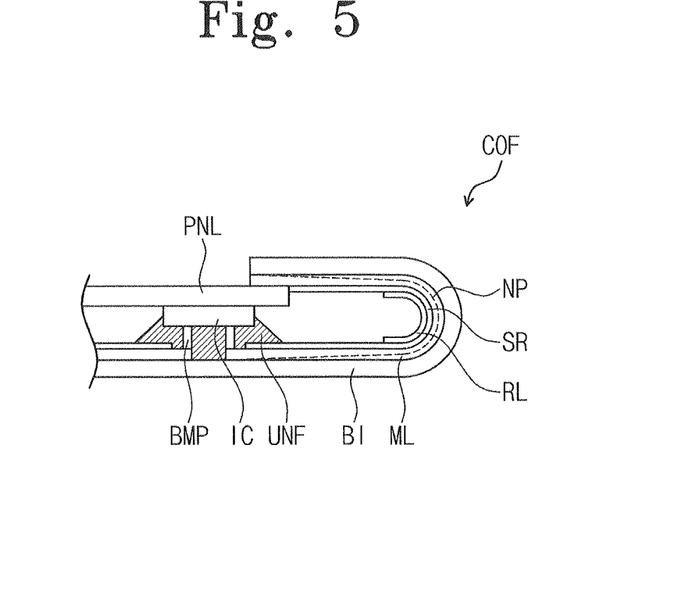
FIG. 5 is a cross-sectional view showing a portion of a display device according to an exemplary embodiment of the present disclosure.

Hereinafter, a display device according to an exemplary embodiment of the present disclosure will be described in detail with reference to FIGS. 3 through 5. In FIGS. 3 through 5, the same reference numerals denote the same elements in FIGS. 1 and 2, and thus detailed descriptions of the same elements will be omitted.

FIG. 3 is a plan view showing a display device according to an exemplary embodiment of the present disclosure, FIG. 4 is a circuit diagram showing a pixel area shown in FIG. 3, and FIG. 5 is a cross-sectional view showing a portion of a display device according to an exemplary embodiment of the present disclosure.

In reference to FIG. 3, the display device includes a display panel PNL and the chip on film COF that is flexible. In addition, the display device further includes a housing (not shown) to accommodate the display panel PNL and a window member (not shown) disposed on the display panel PNL to protect the display panel PNL.

In a case that the display device is an organic electroluminescence display device, the display panel PNL includes a thin film transistor substrate and a sealing layer (not shown), which are sequentially stacked. In a case that the display device is a liquid crystal display device, the display panel PNL includes a thin film transistor substrate and an upper substrate (not shown). In the present exemplary embodiment, only the thin film transistor substrate of the display device PNL has been shown.

In reference to FIG. 3, the display panel PNL includes a display area DA in which an image is displayed and a non-display area NDA disposed adjacent to the display area DA. The chip on film COF is disposed in the non-display area NDA.

In reference to FIGS. 3 and 4, the display area DA includes a plurality of pixels PXL. Each pixel PXL includes a portion of a gate line GL, a portion of a data line DL, a thin film transistor TFT, a pixel electrode PE, an image display layer (not shown), and a common electrode (not shown). These are insulated from each other or make contact with each other. The pixels PXL display images to form a full image on a screen of the display panel PNL.

The gate line GL is extended in a first direction D1 on the thin film transistor substrate in the non-display area NDA and the display area DA. The data line DL is extended in a second direction D2 from the non-display area NDA to the display area DA and insulated from the gate line GL. The first direction D1 crosses the second direction D2.

The gate line GL and the data line DL apply signals to the thin film transistor TFT. The thin film transistor TFT includes a gate electrode, a semiconductor layer, a source electrode, and a drain electrode.

The semiconductor layer is disposed on the gate electrode to be insulated from the gate electrode, and a portion of the semiconductor layer is overlapped with the gate electrode.

The semiconductor layer is formed of an inorganic semiconductor material or an organic semiconductor material. For instance, the semiconductor layer includes semiconductor, amorphous silicon semiconductor, crystalline silicon semiconductor, or polycrystalline silicon semiconductor. The oxide semiconductor includes oxide material including at least one of indium (In), gallium (Ga), zinc (Zn), or tin (Sn). For instance, the semiconductor layer includes an oxide semiconductor, e.g., zinc oxide, tin oxide, indium oxide, indium-zinc-oxide, indium-tin-oxide, indium-gallium-zinc oxide, indium-zinc-tin oxide, indium-gallium-zinc-tin oxide, etc.

The image display layer is disposed on a portion of the pixel electrode PE. When the display device is the organic electroluminescence display device, the image display layer includes a light emitting layer. When the display device is the liquid crystal display device, the image display layer includes a liquid crystal layer.

The light emitting layer may include fluorescent materials to emit red, green, and blue colors to respectively correspond to the pixels PXL. In this case, the pixels that emit the red, green, and blue colors may be referred to as red, green, and blue color pixels respectively corresponding to a red pixel area, a green pixel area, and a blue pixel area. One red pixel, one green pixel, and one blue pixel form one main pixel, but the color of the light exiting from each pixel PXL, i.e., a wavelength of the light, should not be limited thereto or thereby. That is, each pixel PXL may further emit a yellow light or a magenta light, or one pixel PXL may emit a white light.

The common electrode is disposed on the image display layer. One of the pixel electrode PE and the common electrode is an anode and the other one of the pixel electrode PE and the common electrode is a cathode.

The sealing layer is disposed on the common electrode to cover the common electrode.

The non-display area NDA includes a portion of the gate line GL, a portion of the data line DL, a data pad (not shown), and a gate driver GD. The data pad and the gate driver GD are connected to the chip on film COF.

The data pad is extended from the data line DL and covered by the chip on film COF. In addition, the data pad applies an electrical signal from the chip on film COF to the data line DL.

The gate driver GD is disposed at one side of the non-display area NDA and applies an electrical signal to the gate line GL.

The chip on film COF includes the integrated circuit chip IC and the integrated circuit chip IC includes a driver to process the electrical signals applied to the gate driver GD and the data pad. The electrical signals are transmitted by various circuit patterns included in the chip on film COF.

The position and shape of the gate driver GD and the data pad should not be limited thereto or thereby. For instance, the driver that processes the electrical signals of the display device is provided only in the one side portion of the non-display area NDA in a chip on film scheme or a chip on glass scheme.

Although not shown in figures, a side portion of the chip on film COF, which is not connected to the display panel, may be connected to a printed circuit board.

The chip on film COF is attached to the side portion of the non-display area NDA using an anisotropic conductive film. In detail, the metal layer ML of the chip on film COF is attached to the side portion of the non-display area NDA and the solder resist layer SR is not disposed on the area in which the metal layer ML is attached to the side portion of the non-display area NDA.

The chip on film COF is built in the display device in a bent state to accomplish slimness and compactness. Accordingly, the chip on film COF is bent to surround an edge of the non-display area NDA and the integrated circuit chip IC makes contact with a lower surface of the display panel. The integrated circuit chip IC may make contact with the lower surface of the display panel or make contact with the display panel while interposing a bottom cover (not shown) therebetween.

The chip on film COF includes the base insulating layer BI, the metal layer ML disposed on the upper surface of the base insulating layer BI, and the integrated circuit chip IC disposed on the metal layer ML to be electrically connected to the metal layer ML. In addition, the chip on film COF further includes the solder resist layer SR disposed on the metal layer ML to be insulated from the integrated circuit chip IC and the reinforcing layer RL disposed on the solder resist layer SR.

The chip on film COF has flexibility, and thus the neutral surface NP, in which the vector sum of the tensile force and the compressive force becomes substantially zero when the chip on film COF is bent, is placed in the chip on film COF. The neutral surface NP is positioned on the meal layer ML.

To allow the neutral surface NP to be positioned in the metal layer ML, the thickness and the elastic modulus of the reinforcing layer RL are determined to correspond to the thickness and the elastic modulus of the base insulating layer BI, the metal layer ML, and the solder resist layer SR. When the reinforcing layer RL is not disposed on the metal layer ML, the neural surface NP is not positioned in the metal layer ML, but when the reinforcing layer RL is disposed on the metal layer ML, the neural surface NP is positioned in the metal layer ML.

In the present exemplary embodiment, the reinforcing layer RL is disposed on the metal layer ML and the neutral surface NP is positioned in the metal layer ML, and thus the metal layer ML may be prevented from being cracked and the defect may be prevented from occurring in the chip on film COF.

In the above-mentioned chip on film COF, the area of the reinforcing layer RL is smaller than the area of the solder resist layer SR and the reinforcing layer RL is disposed in the area in which the chip on film COF is bent. In this case, since the reinforcing layer RL is additionally disposed on the metal layer ML, the metal layer ML may be prevented from being cracked without increasing the thickness when the chip on film COF is bent.

As shown in FIG. 5, in the chip on film COF, a portion of the neutral surface NP may be positioned in the metal layer ML only in the area in which the chip on film COF is bent, and a remaining portion of the neural surface NP may be positioned at the boundary surface between the metal layer ML and the solder resist layer SR.

In addition, when the reinforcing layer RL is formed of the same material as the solder resist layer SR, the process required to manufacture the chip on film COF may be simplified. That is, when the similar processes, e.g., the processes of coating and curing the liquid insulating resin, are consecutively performed by varying an area in which the resin is coated, the processes required to form the solder resist layer SR and the reinforcing layer RL are simplified, thereby reducing a manufacturing cost of the solder resist layer SR and the reinforcing layer RL.

Figure 6:
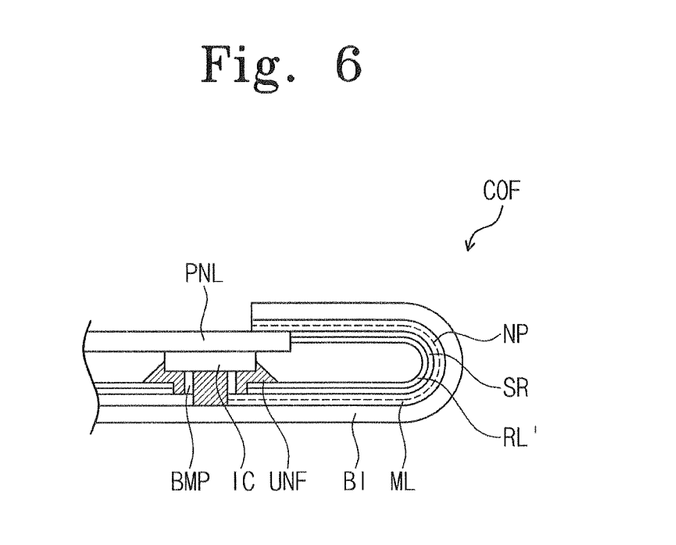
FIG. 6 is a cross-sectional view showing a portion of a display device according to another exemplary embodiment of the present disclosure.

FIG. 6 is a cross-sectional view showing a portion of a display device according to another exemplary embodiment of the present disclosure. In FIG. 6, the same reference numerals denote the same elements in FIGS. 1 through 5, and thus detailed descriptions of the same elements will be omitted.

In the present exemplary embodiment shown in FIG. 6, the area of the reinforcing layer RL' is equal to the area of the solder resist layer SR. Therefore, the reinforcing layer RL' is not spaced apart from the underfill UNF when viewed in a plan view, and thus a portion of the reinforcing layer RL' is covered by the underfill UNF.

In this case, although the area in which the chip on film COF is bent is changed, the neutral surface NP is positioned in the metal layer ML. That is, even though any area of the chip on film COF is bent except for the area in which the integrated circuit chip IC is disposed, the neutral surface NP in the area in which the chip on film COF is bent is positioned in the metal layer ML, and thus the metal layer ML may be prevented from being cracked.

When the reinforcing layer RL' is formed of the same material as the solder resist layer SR, the process of manufacturing the chip on film COF is more simplified and the manufacturing cost of the chip on film COF is reduced. That is, when the similar processes, e.g., the processes of coating and curing the liquid insulating resin, are consecutively performed by varying the area in which the resin is coated, the processes required to form the solder resist layer SR and the reinforcing layer RL' are simplified, thereby reducing the manufacturing cost of the chip on film COF including the solder resist layer SR and the reinforcing layer RL'. In the present exemplary embodiments shown in FIG. 6, a thickness of the solder resist SR may be about 5 micrometers to about 25 micrometers, and a thickness of the reinforcing layer RL' is about 30 micrometers to about 40 micrometers.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible chip on film, comprising:
    a base insulating layer configured to one end portion connected to a display panel and other one end portion connected to a primed circuit board;
    a metal layer disposed on an upper surface of the base insulating layer and including a circuit pattern;
    an integrated circuit chip disposed on an upper surface of the metal layer and electrically connected to the metal layer;
    a solder resist layer disposed on the upper surface of the metal layer and electrically insulated from the integrated circuit chip; and
    a reinforcing layer disposed on an upper surface of the solder resist layer and the reinforcing layer covering a whole curvature area of the flexible chip on film,
    wherein the solder resist layer is disposed between the metal layer and the reinforcing layer,
    wherein the integrated circuit chip is disposed on a portion of the base insulating layer between the one end portion and the other one end portion and partially overlaps the solder resist layer and the reinforcing layer in plan view, and
    wherein a neutral surface, in which a vector sum of a tensile force and a compressive force becomes substantially zero when the flexible chip on film is bent, is placed in the metal layer.

2. The chip on film of claim 1, wherein the solder resist layer comprises a cured resin.

3. The chip on film of claim 2, wherein the reinforcing layer has an area equal to or smaller than an area of the solder resist layer.

4. The chip on film of claim 3, wherein the reinforcing layer has a film shape.

5. The chip on film of claim 3, wherein the reinforcing layer comprises a same material as the solder resist layer, and the reinforcing layer is positioned in an area in which the chip on film is bent.

6. A display device, comprising:
    a display panel that includes a display area in which an image is displayed and a non-display area disposed adjacent to the display area;
    a chip on film disposed at one side of the non-display area and having flexibility; and
    a printed circuit board disposed at one side of the chip on film, the chip on film comprising:
    a base insulating layer configured to one end portion connected to the display panel and other one end portion connected to the printed circuit board;
    a metal layer disposed on an upper surface of the base insulating layer and the metal layer includes a circuit pattern;
    an integrated circuit chip disposed on an upper surface of the metal layer and electrically connected to the metal layer;
    a solder resist layer disposed on the upper surface of the metal layer and electrically insulated from the integrated circuit chip; and a reinforcing layer disposed on an upper surface of the solder resist layer and the reinforcing layer covering a whole bending curvature area of the chip on film, wherein the solder resist layer is disposed between the metal layer and the reinforcing layer, wherein the integrated circuit chip is disposed on a portion of the base insulating layer between the one end portion and the other one end portion and partially overlaps the solder resist layer and the reinforcing layer in plan view, and wherein a neutral surface in which a vector sum of a tensile force and a compressive force becomes substantially zero when the chip on film is bent, is placed in the metal layer.

7. The display device of claim 6, wherein the chip on film is bent to surround an edge of the non-display area and the integrated circuit chip makes contact with a lower surface of the display panel.

8. The display device of claim 7, wherein the solder resist layer comprises a cured resin.

9. The display device of claim 8, wherein the reinforcing layer has an area equal to or smaller than an area of the solder resist layer.

10. The display device of claim 9, wherein the reinforcing layer has a film shape.

11. The display device of claim 10, wherein the reinforcing layer comprises a same material as the solder resist layer and is positioned in an area in which the chip on film is bent.

12. A display device comprising:
a display panel that includes a display area in which an image is displayed and a non-display area disposed adjacent to the display area;
a chip on film disposed at one side of the non-display area and having flexibility; and
a printed circuit board disposed at one side of the chip on film, the chip on film comprising:
a base insulating layer configured to one end portion connected to the display panel and other one end portion connected to the printed circuit board;
a metal layer disposed on an upper surface of the base insulating layer and the metal layer includes a circuit pattern;
an integrated circuit chip disposed on an upper surface of the metal layer and electrically connected to the metal layer;
a solder resist layer disposed on the upper surface of the metal layer and electrically insulated from the integrated circuit chip;
a reinforcing layer disposed on an upper surface of the solder resist layer and the reinforcing layer covering a whole bending curvature area of the chip on film, and
an underfill filled around the integrated circuit chip and overlapping with the solder resist layer,
wherein the solder resist layer is disposed between the metal layer and the reinforcing layer,
wherein the integrated circuit chip is disposed on a portion of the base insulating layer between the one end portion and the other one end portion and partially overlaps the solder resist layer and the reinforcing layer in plan view, and
wherein a neutral surface, in which a vector sum of a tensile force and a compressive force becomes substantially zero when the chip on film is bent, is placed in the metal layer.

* * * * *